US007923686B2

(12) United States Patent
Fukushima

(10) Patent No.: US 7,923,686 B2
(45) Date of Patent: Apr. 12, 2011

(54) TRANSMISSION ELECTRON MICROSCOPE

(75) Inventor: Kurio Fukushima, Tokyo (JP)

(73) Assignee: JEOL Ltd., Tokyo (JP)

( * ) Notice: Subject to any disclaimer, the term of this patent is extended or adjusted under 35 U.S.C. 154(b) by 198 days.

(21) Appl. No.: 12/330,128

(22) Filed: Dec. 8, 2008

(65) Prior Publication Data

US 2009/0159797 A1   Jun. 25, 2009

(30) Foreign Application Priority Data

Dec. 21, 2007   (JP) ................................. 2007-329552

(51) Int. Cl.
*H01J 37/26* (2006.01)
(52) U.S. Cl. ......... 250/311; 250/306; 250/307; 250/310
(58) Field of Classification Search .................. 250/306, 250/307, 310, 311
See application file for complete search history.

(56) References Cited

U.S. PATENT DOCUMENTS

| 6,803,570 | B1 * | 10/2004 | Bryson et al. | 250/305 |
| 7,388,211 | B2 * | 6/2008 | Chao et al. | 250/441.11 |
| 2008/0093565 | A1 * | 4/2008 | Yaguchi et al. | 250/440.11 |
| 2009/0045337 | A1 * | 2/2009 | Kimura | 250/310 |
| 2009/0256075 | A1 * | 10/2009 | Kemen et al. | 250/307 |

FOREIGN PATENT DOCUMENTS

| JP | 05-258701 | 10/1993 |
| JP | 08-329876 | 12/1996 |
| JP | 2002-134055 | 5/2002 |
| JP | 2007-066715 | 3/2007 |

* cited by examiner

*Primary Examiner* — Robert Kim
*Assistant Examiner* — Michael Maskell
(74) *Attorney, Agent, or Firm* — The Webb Law Firm

(57) ABSTRACT

An apparatus which permits high-angle annular dark-field (HAADF) imaging comprises an electron gun, a specimen chamber in which a specimen is set, a gas cylinder for supplying environmental gas around the surface of the specimen through both a gas flow rate controller and a gas nozzle, a vacuum pump for evacuating the inside of the specimen chamber, an objective lens including upper and lower polepieces, a detector for detecting electrons transmitted through the specimen, a display device for displaying a transmission image of the specimen, orifice plates having minute holes, holders supporting the orifice plates, a drive mechanism for driving the holders, and a motion controller. The orifice plates can be moved in a direction crossing the optical axis of the beam on the upper and lower surfaces of the upper and lower polepieces of the objective lens.

3 Claims, 3 Drawing Sheets

TRANSMISSION ELECTRON MICROSCOPE

BACKGROUND OF THE INVENTION

1. Field of the Invention

The present invention relates to a transmission electron microscope having means for supplying gas into the specimen chamber.

2. Description of Related Art

One example of transmission electron microscope having means for supplying gas into the specimen chamber is schematically shown in FIG. 1. The microscope has an electron gun chamber 1 in which an electron gun 2 emitting an electron beam is mounted. The microscope further includes an illumination lens chamber 3 in which condenser lenses 4 and scan coils 6 are mounted. The condenser lenses 4 converge the electron beam. The scan coils 6 scan the converged beam over the surface of a specimen 5 in two dimensions (in X- and Y-directions).

The microscope further includes a specimen chamber 7 in which the specimen 5 is disposed. The specimen 5 is mounted to a side entry specimen holder (not shown), which in turn is mounted between the upper polepiece 8 and lower polepiece 9 of an objective lens. Each of the upper polepiece 8 and lower polepiece 9 is provided with an electron beam passage hole. Orifices 11a and 11b are mounted at higher and lower positions, respectively, in the electron beam passage hole formed in the upper polepiece 8 of the objective lens. Similarly, orifices 11c and 11d are mounted at higher and lower positions, respectively, in the electron beam passage hole formed in the lower polepiece 9 to hinder an environmental gas introduced into the specimen chamber 7 from flowing into other portions. A vacuum gauge (not shown) for measuring the degree of vacuum in the specimen chamber 7 is also mounted in the specimen chamber 7.

The electron microscope further includes an imaging lens chamber 12 in which an intermediate lens 16a and a projector lens 16b are mounted to cause the electrons transmitted through the specimen 5 and converged by the objective lens to be magnified and projected onto a fluorescent screen 14 disposed in an observation chamber 13.

The fluorescent screen can be retracted from the optical axis O of the electron beam by fluorescent screen-retracting means (not shown). A CCD camera 15 can detect the magnified image. The output signal from the camera 15 is fed to a controller 18 via an A/D converter 17. The controller controls various components of the transmission electron microscope and performs various calculations.

A display device 19 has a display screen on which an image of the specimen (e.g., a transmission electron image of the specimen) is displayed based on the image signal from the controller 18. Input devices 20, such as a computer mouse and a keyboard, are connected with the controller 18.

A vacuum pump 31 is used to evacuate the inside of the electron gun chamber 1. Another vacuum pump 32 evacuates the insides of the illumination lens chamber 3, imaging lens chamber 12, and observation chamber 13. A further vacuum pump 33 evacuates a space surrounded between the orifice 11a in the upper polepiece 8 of the objective lens and the orifice 11b via an evacuation tube 34. The vacuum pump 33 also evacuates a space between the orifice 11c in the lower polepiece 9 of the objective lens and the orifice 11d via an exhaust pipe 35. An additional vacuum pump 36 evacuates the inside of the specimen chamber 7.

The environmental gas introduced into the specimen chamber 7 is stored in a gas cylinder 37. The gas cylinder 37 is opened and closed by a gas valve 38. The flow rate of the environmental gas from the gas cylinder 37 is adjusted by a gas flow rate controller 39. A gas nozzle 40 is used to introduce the environmental gas from the gas cylinder 37 into vicinities of the specimen 5. The portion of nozzle 40 is located inside the specimen chamber and the front end of the gas nozzle 40 is located immediately above the specimen 5.

Where a transmission electron image should be obtained by the transmission electron microscope of this structure, the electron beam from the electron gun 2 is converged by the condenser lenses 4 and passes through the upper polepiece 8 of the objective lens. Then, the beam is focused onto the surface of the specimen 5.

At this time, the electrons transmitted through the specimen are passed through the lower polepiece 9 of the objective lens, intermediate lens 16a, and projector lens 16b. As a result, the cross section of the beam is magnified in turn. A magnified image is displayed on the fluorescent screen 14.

The fluorescent screen 14 is retracted by the fluorescent screen-retracting means (not shown) and the magnified image is detected by the CCD camera 15. The output signal from the camera 15 is furnished to the controller 18 via the A/D converter 17. The transmission electron signal is processed in a given manner by the controller 18 and sent to the display device 19. Consequently, a transmission electron image is displayed on the display screen of the display device.

In this transmission electron microscope, the environmental gas may sometimes be blown against around the specimen 5 to make in situ observation of the process of spontaneous reactions between the specimen 5 and the environmental gas.

Where such an image observation is performed, a given amount of environmental gas is supplied around the specimen 5 inside the specimen chamber 7 via the gas nozzle 40 from the gas cylinder 37 by opening the gas valve 38 and sending a flow rate drive signal from the controller 18 to the gas flow rate controller 39 under instructions from the controller 18. This induces a reaction with the specimen.

At this time, the orifices 11a, 11b, 11c, and 11d located at higher and lower positions in the electron beam passage holes formed in the upper polepiece 8 and lower polepiece 9 of the objective lens suppress the environmental gas in the specimen chamber 7 from flowing into the illumination lens chamber 3 and imaging lens chamber 12. Consequently, the degrees of vacuum in the chambers are maintained at levels normally used during observation.

After desired reactions, the supply of the environmental gas to the specimen 5 is once halted. The inside of the specimen chamber 7 is evacuated by the vacuum pump 36 and then the electron beam irradiation is resumed. An image of the specimen can be displayed on the display device 19 under a vacuum environment (see JP8-329876).

Where an atomic array of a specimen is observed at high resolution with an electron microscope, dark field imaging, such as the technique of high-angle annular dark-field (HAADF) imaging, is adopted. In this method, an annular detector is prepared as a detector for dark field microscopy. Only the portions of the electrons transmitted through the specimen which are scattered at high angles and which thus impinge on the annular portion of the detector are detected by this annular portion. A dark field image based on electrons detected by the detector is displayed on a display device. The dark field image obtained by this method suffers from less diffraction effects. It is possible to clearly observe a dark field image whose contrast is seen to vary with atomic number.

However, where this method of observation is applied to a transmission electron microscope having means for supplying gas into the specimen chamber, electrons passing through the specimen at high scattering angles as described above are blocked off by the orifices 11c and 11d fixed to the lower polepiece 9 of the objective lens. Hence, there is the danger that these electrons cannot reach the detection surface of the dark field detector (not shown) disposed in the observation chamber 13.

The process of reaction between the specimen and the environmental gas depends on the pressure of the gas around the specimen. If the orifices are placed at rest, the diameters of the openings of the orifices are fixed. Consequently, the maximum allowable pressure of the environmental gas that can be introduced into the specimen chamber 7 is fixed.

SUMMARY OF THE INVENTION

It is an object of the present invention to provide a novel transmission electron microscope free from the foregoing problems.

A transmission electron microscope, according to one embodiment of the present invention, has a gun for producing an electron beam, a specimen chamber in which a specimen is set, a gas supply for supplying gas at a controlled flow rate at least to around a surface of the specimen, an evacuation pump for evacuating the inside of the specimen chamber, an objective lens having an upper polepiece and a lower polepiece, the upper polepiece being disposed at a higher position in the specimen chamber, the lower polepiece being located at a lower position in the specimen chamber, a detector for detecting electrons transmitted through the specimen, and display device for displaying a transmission image of the specimen based on an output signal from the detector. Beam-blocking plates capable of blocking off the electron beam by being moved in a direction crossing the optical axis of the beam are disposed on upper and lower surfaces of the upper and lower polepieces, respectively, of the objective lens.

A transmission electron microscope, according to another embodiment of the present invention, has a gun for producing an electron beam, a specimen chamber in which a specimen is set, a gas supply for supplying gas at a controlled flow rate at least to around a surface of the specimen, an evacuation pump for evacuating the inside of the specimen chamber, an objective lens having an upper polepiece and a lower polepiece, the upper polepiece being disposed at a higher position in the specimen chamber, the lower polepiece being located at a lower position in the specimen chamber, detector for detecting electrons transmitted through the specimen, and display device for displaying a transmission image of the specimen based on an output signal from the detector. Plates having holes permitting passage of the electron beam are disposed on upper and lower surfaces of the upper and lower polepieces, respectively, of the objective lens. The plates are disposed so as to be movable in a direction crossing the optical axis of the beam.

According to the present invention, where imaging is performed on a transmission electron microscope having a source for supplying gas into the specimen chamber, when dark field imaging is done using high-angle annular dark-field (HAADF) microscopy, electrons scattered at high angles reach the detector without being blocked off on their way to the detector. Consequently, a sufficient amount of electrons is detected by the detector. As a result, a clear HAADF image can be produced.

In addition, the aperture diameters of the orifices can be varied. This permits the maximum allowable pressure of the environmental gas that can be introduced into the specimen chamber to be varied according to the imaging purpose.

Other objects and features of the invention will appear in the course of the description thereof, which follows.

DESCRIPTION OF THE PREFERRED EMBODIMENTS

Embodiments of the present invention are hereinafter described in detail with reference to the drawings.

Figure 1:
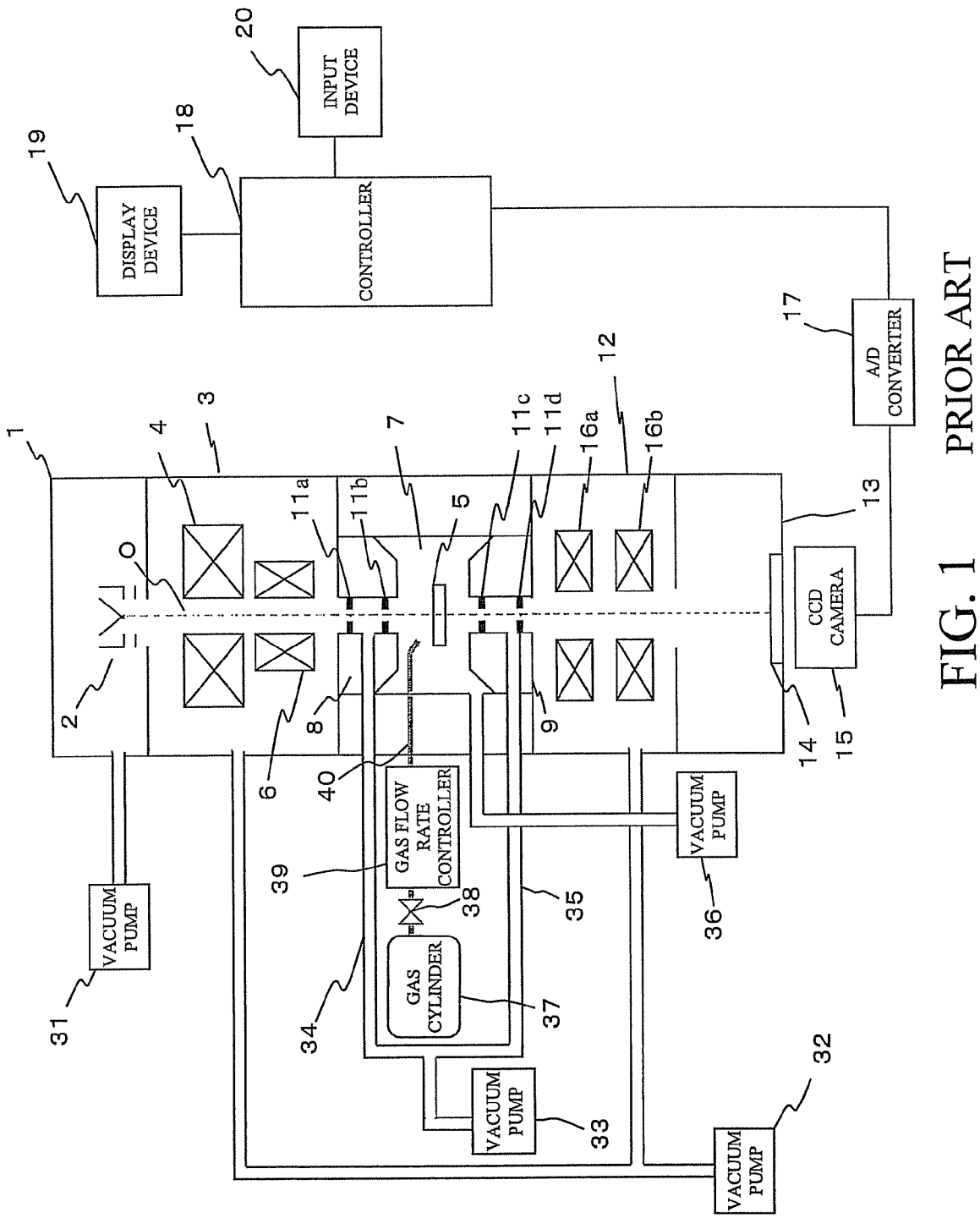
FIG. 1 is a schematic block diagram of a conventional transmission electron microscope having a source for supplying gas into the specimen chamber.
Figure 2:
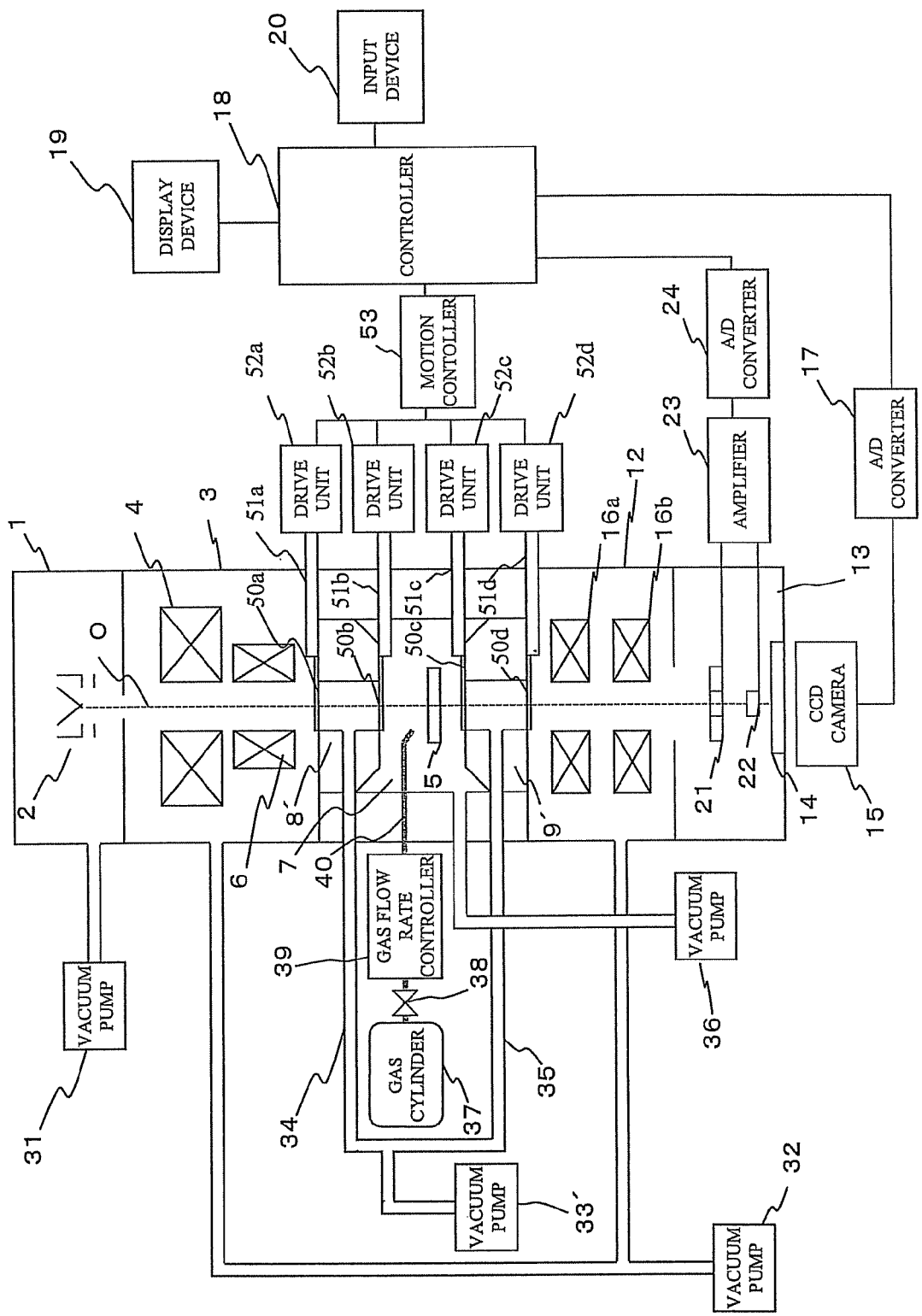
FIG. 2 is a schematic block diagram of a transmission electron microscope having a source for supplying gas into the specimen, illustrating one example of instrument implementing the present invention.

One example of transmission electron microscope having a source for supplying gas into the specimen chamber is schematically shown in FIG. 2, illustrating one example of instrument implementing the present invention. In various figures including FIG. 1 already referenced, like components are indicated by like reference numerals.

The microscope has the objective lens including an upper polepiece 8' and a lower polepiece 9' which are disposed at a higher position and a lower position, respectively, inside the specimen chamber 7.

Orifice plates 50a and 50b capable of moving in a direction crossing the electron beam passage holes are supported to holders 51a and 51b, respectively, on the upper and lower surfaces, respectively, of the upper polepiece 8' of the objective lens.

Figure 3:
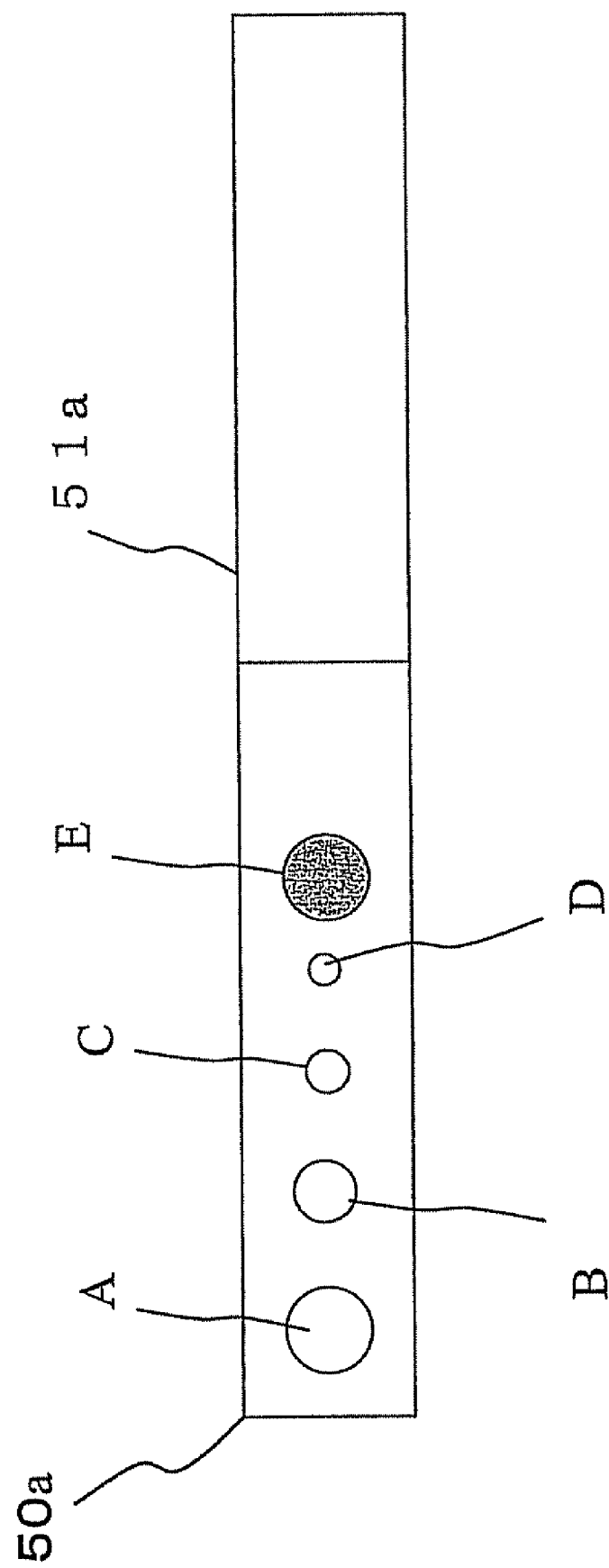
FIG. 3 is a detailed view of a part of the instrument shown in FIG. 2.

FIG. 3 shows one example of the orifice plate 50a supported to the holder 51a. The orifice plate is provided with plural holes arrayed along the direction of movement. For example, the holes include a hole A having a diameter of 2,000 μm, a hole B having a diameter of 400 μm, a hole C having a diameter of 200 μm, a hole D having a diameter of 100 μm, and a hole E having a diameter of 2,000 μm. The hole E is coated with a thin film permitting passage of the electron beam. The orifice plate 50b supported to the holder 51b is similar in structure with the orifice plate 50a. The thin film coating the hole E is made, for example, of carbon or of carbon and aluminum. Alternatively, the thin film is made of carbon and plastic. The thin film is tens of nanometers thick or less and viscously bonded to the periphery of the hole E so as to cover it, for example, with a vacuum compatible adhesive.

Similarly, the orifice plates 50c and 50d capable of moving in a direction crossing the electron beam passage holes are held to the holders 51c and 51d, respectively, on the upper and lower surfaces, respectively, of the lower polepiece 9' of the objective lens. The orifice plates 50c and 50d held to the holders 51c and 51d, respectively, are each provided with plural holes arrayed along the direction of movement similarly to the orifice plate 50a held to the holder 51a.

Drive units 52a, 52b, 52c, and 52d move the holders 51a, 51b, 51c, and 51d, respectively. A motion controller 53 supplies motion signals to the drive units 52a-52d in response to motion instructions from the controller 18. A holding mechanism (not shown) is incorporated in each orifice plate to permit the orifice plate to be brought into intimate contact with the upper or lower surface of the upper polepiece 8' or lower polepiece 9' of the objective lens when the orifice plate is placed on the upper or lower surface. When each holder 51a, 51b, 51c, or 51d moves, the holding mechanism permits the orifice plate to be released from the upper or lower surface.

The output signals from movable dark field detector 21 and bright field detector 22 disposed in the observation chamber 13 are fed to an amplifier 23. The output signal from the amplifier 23 is sent to the controller 18 via an A/D converter 24. A space between the orifice plates 50a and 50b of the upper polepiece 8' of the objective lens is evacuated by a vacuum pump 33' via the exhaust tube 34. A space between the orifice plates 50c and 50d of the lower polepiece 9' of the objective lens is also evacuated by the pump 33' via the exhaust pipe 35.

In the transmission electron microscope of the structure constructed as described so far, where the reaction process of the specimen is observed, an environmental gas pressure corresponding to the reaction rate is first set. The holders 51a, 51b, 51c, and 51d supporting the orifice plates 50a, 50b, 50c, and 50d are moved in such a way that a holeless portion or a hole having a diameter large enough to prevent the environmental gas contained in the specimen chamber 7 under the set gas pressure from leaking into the illumination lens chamber 3 and into the imaging lens chamber 12 (otherwise, the degree of vacuum would be deteriorated) is selected and brought onto the optical axis O of the electron beam. The orifice plates are brought into intimate contact with and coupled to the upper and lower surfaces of the upper polepiece 8' and lower polepiece 9' of the objective lens.

For example, where the reaction rate is set to a moderate level, the pressure of the gas around the specimen is set to about 1 kPa. The holders 51a-51d are moved in such a way that holes having diameters of less than 200 μm, for example, are placed as the holes of the orifice plates 50a-50d on the optical axis) of the electron beam and that the orifice plates are brought into intimate contact with and coupled to the upper and lower surfaces of the upper polepiece 8' and lower polepiece 9' of the objective lens.

On the other hand, where the reaction rate is set to a higher level, the pressure of the gas around the specimen is set to higher than 1 kPa. The holders 51a-51d are moved in such a way that holes having diameters of less than 100 μm, for example, are placed as the holes of the orifice plates 50a-50d on the optical axis O of the electron beam and that the orifice plates are brought into intimate contact with and coupled to the upper and lower surfaces of the upper polepiece 8' and lower polepiece 9' of the objective lens.

Where the reaction rate is set to a lower level, the pressure of the gas around the specimen is set to lower than 1 kPa. The holders 51a-51d are moved in such a way that holeless portions or holes having diameters of less than 400 μm, for example, are placed as the holes of the orifice plates 50a-50d on the optical axis O of the electron beam and that the orifice plates are brought into intimate contact with and coupled to the upper and lower surfaces of the upper polepiece 8' and lower polepiece 9' of the objective lens.

The case where the reaction rate is set to the moderate level is described as an example. When the gas valve 38 is opened in response to an instruction from the controller 18, the environmental gas is supplied from the gas cylinder 37 into the specimen chamber 7 via the gas flow rate controller 39 and gas nozzle 40. At this time, the gas flow rate controller 39 adjusts the gas flow rate from the gas cylinder 37 such that the gas pressure inside the specimen chamber 7 becomes substantially equal to 1 kPa. The pressure inside the specimen chamber 7 is constantly monitored, for example, by a vacuum gauge (not shown). The controller 18 appropriately controls the adjustment of the gas flow rate made by the gas flow rate controller 39 in response to the output signal from the vacuum gauge.

At the same time, the motion controller 53 sends motion signals to the drive units 52a-52d under instructions from the controller 18. When the drive units 52a-52d move the holders 51a-51d, respectively, such that the holes C having a diameter of 200 μm in the orifice plates 50a-50d mounted to the drive units are brought onto the optical axis O of the beam, the orifice plates are brought into intimate contact with and coupled to the upper and lower surfaces of the upper polepiece 8' and lower polepiece 9' of the objective lens.

Because of these operations, the environmental gas is blown around the surface of the specimen 5 via the gas flow rate controller 39 and gas nozzle 40 from the gas cylinder 37. This induces a moderate level of reaction at the surface of the specimen.

At this time, the holes C in the orifice plates 50a, 50b, 50c, and 50d which are located on the upper and lower surfaces of the upper polepiece 8' and on the upper and lower surfaces of the lower polepiece 9', respectively, of the objective lens are located on the optical axis O of the electron beam. Therefore, the environmental gas within the specimen chamber 7 is suppressed from leaking into the illumination lens chamber 3 and into the imaging lens chamber 12 via the holes C in the orifice plates. Consequently, electron microscopy observations are not hindered.

In the above embodiment, the holes C in the orifice plates are brought onto the optical axis O of the electron beam. The holes D smaller in diameter than the holes C may also be placed onto the optical axis O.

After the observation of the reaction between the specimen surface and the environmental gas is terminated in this way, the gas valve is closed under an instruction from the controller 18 to the supply of the environmental gas onto the specimen 5. The inside of the specimen chamber is evacuated to a desired pressure (i.e., degree of vacuum) by the vacuum pump 36.

At the same time, the motion controller 53 sends motion signals to the drive units 52a, 52b, 52c, and 52d in response to instructions from the controller 18. The drive units 52a-52d move the holders 51a-51d, respectively, such that the holes A having a diameter of 2,000 μm, for example, in the orifice plates 50a-50d mounted to the drive units are brought onto the optical axis O of the electron beam. The orifice plates are brought into intimate contact with and coupled to the upper and lower surfaces of the upper polepiece 8' and lower polepiece 9' of the objective lens.

In the above embodiment, the holes A having a diameter of 2,000 μm are brought onto the optical axis O of the beam. Holes of other diameters may also be brought onto the optical axis. The holders may be moved such that the orifice plates 50a-50d are brought completely out of the optical axis O of the beam.

Under the above-described condition, if dark field imaging is done, the electron beam from the electron gun 2 is accelerated by a desired accelerating voltage. The accelerated beam is converged by the condenser lenses 4. The beam passing through the holes A in the orifice plates 50a and 50b is focused onto the surface of the specimen 5 by the upper polepiece 8' of the objective lens. The beam is scanned in two dimensions over the surface of the specimen 5 by the scan coils 6.

At this time, electrons scattered by the specimen 5 and passing through the holes A in the orifice plates 50c and 50d are directed at the detection surface of the dark field detector 21 by the lower polepiece 9' of the objective lens, intermediate lens 16a, and projector lens 16b. The output signal from the dark field detector is fed to the controller 18 via the amplifier 23 and A/D converter 24. The dark field signal is processed in a given manner by the controller 18 and sent to the display device 19. As a result, a dark field image is displayed on the display screen of the display device.

If an HAADF image is to be observed rather than a simple dark field image, an annular detector capable of efficiently detecting electrons scattered from the specimen at high angles, for example, of about 70 to 150 mrad, is mounted as the dark field detector 21. The holders 51c and 51d are moved such that the holes A having the maximum diameter of 2,000 μm, for example, at least in the orifice plates 50c and 50d, are brought onto the optical axis O of the electron beam. Alternatively, the holders are moved such that the orifice plates 50c and 50d are completely brought out of the optical axis O of the beam. Thus, electrons scattered at high angles are detected by the annular detector without being blocked off by the orifice plates 50c and 50d. An HAADF image having contrast depending on atomic number can be obtained.

Because a sufficient amount of electrons is detected by the detector such that electrons scattered at high angles are not blocked off on their way to the detector in this way, a clear HAADF image suffering from less diffraction effects can be produced.

Sometimes, the process of reaction of the specimen may be observed at a higher gas pressure, for example, of tens of kPa or higher. This case is described below.

The gas valve 38 is opened under an instruction from the controller 18 to supply the environmental gas from the cylinder 37 into the specimen chamber 7 via the gas flow rate controller 39 and gas nozzle 40. At this time, the gas flow rate controller 39 adjusts the gas flow rate from the gas cylinder 37 based on the pressure signal monitored by the vacuum gauge (not shown) such that the gas pressure inside the specimen chamber 7 becomes equal to a desired pressure.

At the same time, the motion controller 53 sends motion signals to the drive units 52b and 52c according to instructions from the controller 18. The drive units 52b and 52c move the holders 51b and 51c, respectively, to bring the holes E in the mounted orifice plates 50b and 50c, which are coated with a film that transmits the electron beam but is impermeable to the environmental gas, onto the optical axis O of the electron beam. The orifice plates are brought into intimate contact with and coupled to the upper and lower surfaces of the upper polepiece 8' and lower polepiece 9' of the objective lens.

Because of these operations, the environmental gas is blown around the specimen 5 via the gas flow rate controller 39 and gas nozzle 40 from the gas cylinder 37. The environmental gas induces the specimen to begin to react. At this time, the holes E in the orifice plates 50b and 50c at which the lower surface of the upper polepiece 8' and the upper surface of the lower polepiece 9' of the objective lens are respectively located are located on the optical axis O of the electron beam. Therefore, the environmental gas within the specimen chamber 7 is prevented from leaking into the illumination lens chamber 3 and into the imaging lens chamber 12 via the holes E in the orifice plates.

Under this condition, the electron beam from the electron gun 2 is accelerated by a desired accelerating voltage. The accelerated beam is focused onto the surface of the specimen 5 through the holes E in the orifice plate 50b and through the upper polepiece 8' of the objective lens by the condenser lenses 4.

At this time, electrons transmitted through the specimen 5 and passed through the hole E in the orifice plate 50c pass through the lower polepiece 9' of the objective lens, intermediate lens 16a, and projector lens 16b. Finally, the electrons impinge on the detection surface of the CCD camera 15. The output signal from the camera is fed to the controller 18 via the A/D converter 17. The signal is processed in a given manner by the controller 18 and sent to the display device 19. The manner in which the environmental gas reacts with the specimen surface is displayed on the display screen of the display device.

The numbers of the holes formed in the orifice plates and the diameters of the holes are not limited to the numerical values recited in the description of the present embodiment.

Having thus described our invention with the detail and particularity required by the Patent Laws, what is desired protected by Letters Patent is set forth in the following claims.

The invention claimed is:

1. A transmission electron microscope comprising:
   means for producing an electron beam;
   a specimen chamber in which a specimen may be positioned;
   gas supply means for supplying gas at a controlled flow rate at least around a surface of the specimen;
   evacuation means for evacuating the inside of the specimen chamber;
   an objective lens having an upper polepiece and a lower polepiece, the upper polepiece being disposed at a higher position in the specimen chamber, the lower polepiece being disposed at a lower position in the specimen chamber;
   detection means for detecting electrons transmitted through the specimen;
   display means for displaying a transmission image of the specimen based on an output signal from the detection means; and
   beam-blocking plates disposed on upper and lower surfaces of the upper and lower polepieces, respectively, of the objective lens, all the beam-blocking plates being capable of blocking off the electron beam or passing the electron beam by being moved in a direction crossing the optical axis of the beam, wherein each of said plates is provided with plural holes which are different from each other in diameter and can be brought onto the optical axis.

2. A transmission electron microscope comprising:
   means for producing an electron beam;
   a specimen chamber in which a specimen may be positioned;
   gas supply means for supplying gas at a controlled flow rate at least around a surface of the specimen;
   evacuation means for evacuating the inside of the specimen chamber;
   an objective lens having an upper polepiece and a lower polepiece, the upper polepiece being disposed at a higher position in the specimen chamber, the lower polepiece being disposed at a lower position in the specimen chamber;
   detection means for detecting electrons transmitted through the specimen;
   display means for displaying a transmission image of the specimen based on an output signal from the detection means; and
   plates disposed on upper and lower surfaces of the upper and lower polepieces, respectively, of the objective lens, so as to be movable in a direction crossing the optical axis of the beam, the plates having holes permitting passage of the electron beam, wherein said holes are coated with a film that is impermeable to the gas but transmits the electron beam.

3. A transmission electron microscope comprising:

means for producing an electron beam;

a specimen chamber in which a specimen may be positioned;

gas supply means for supplying gas at a controlled flow rate at least around a surface of the specimen;

evacuation means for evacuating the inside of the specimen chamber;

an objective lens having an upper polepiece and a lower polepiece, the upper polepiece being disposed at a higher position in the specimen chamber, the lower polepiece being disposed at a lower position in the specimen chamber;

detection means for detecting electrons transmitted through the specimen;

display means for displaying a transmission image of the specimen based on an output signal from the detection means; and plates disposed on upper and lower surfaces of the upper and lower polepieces, respectively, of the objective lens, so as to be movable in a direction crossing the optical axis of the beam, the plates having holes permitting passage of the electron beam, and wherein at least one of said plural holes is coated with a film that is impermeable to the gas but transmits the electron beam, wherein each of said plates is provided with plural holes, and wherein at least one of said plural holes is coated with a film that is impermeable to the gas but transmits the electron beam.

* * * * *